(12) United States Patent
Negishi et al.

(10) Patent No.: US 6,996,035 B2
(45) Date of Patent: Feb. 7, 2006

(54) OPTICAL PICKUP DEVICE

(75) Inventors: Hiroyuki Negishi, Gunma (JP);
Hideyuki Saikawa, Gunma (JP);
Hisayuki Ito, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 511 days.

(21) Appl. No.: 10/386,014

(22) Filed: Mar. 11, 2003

(65) Prior Publication Data
US 2003/0202454 A1    Oct. 30, 2003

(30) Foreign Application Priority Data
Apr. 26, 2002    (JP)    .............................. 2002-125874
May 10, 2002    (JP)    .............................. 2002-135647

(51) Int. Cl.
*G11B 7/00*    (2006.01)
(52) U.S. Cl. ................................... 369/44.11
(58) Field of Classification Search .................... None
See application file for complete search history.

(56) References Cited

U.S. PATENT DOCUMENTS

| | | | |
|---|---|---|---|
| 5,528,403 A | * | 6/1996 | Kawaguchi et al. ......... 349/149 |
| 5,559,571 A | * | 9/1996 | Miyamoto et al. ............ 396/52 |
| 6,831,882 B1 | * | 12/2004 | Takashima et al. ...... 369/44.14 |
| 2001/0028621 A1 | * | 10/2001 | Moriyama ............. 369/112.23 |

* cited by examiner

*Primary Examiner*—Tawfik A. Goma
(74) *Attorney, Agent, or Firm*—Hogan & Hartson, L.L.P.

(57) ABSTRACT

A laser driving integrated circuit (8) to drive a laser element is mounted in an optical housing, and a wiring pattern of an actuator line (6) for supplying an actuator (1) with drive signals to drive the actuator (1) through a relay circuit board and a wiring pattern of a laser drive line (5) for supplying drive signals from the laser driving integrated circuit (8) to the laser element are formed on the same flexible wiring board (4), and, when the flexible wiring board (4) is folded, a shielding part (7) connected to the ground line is arranged to intervene between the overlapping wiring patterns of the actuator line (6) and the laser drive line (5) of the flexible wiring board (4).

4 Claims, 6 Drawing Sheets

OPTICAL PICKUP DEVICE

BACKGROUND OF THE INVENTION

1. Field of the Invention

The present invention relates to an optical pickup device assembled by an actuator to an optical housing, and more particularly to an optical pickup device using a flexible wiring board for electrical coupling with a circuit board on the apparatus side.

2. Description of the Related Art

In an optical pickup device for optically reading or writing signals on a signal recording medium, such as a disk, a circuit board on the apparatus side is connected through a transmission cable to a laser drive element and a photodetector and supplies power to, or exchanges signals with, the laser drive element and the photodetector.

In the optical pickup device, a flexible wiring board is used as the transmission cable between the circuit board and the optical pickup device.

In a typical such optical pickup device incorporating an integrated circuit for laser drive, the laser driving integrated circuit, laser element, actuator and light-detecting element are mounted in a housing and electrically connected by a flexible wiring board. The flexible wiring board must be folded to be positioned. When the flexible wiring board is folded and the actuator line for driving the actuator and the laser drive line are laid in the same flexible wiring board, for example, when it is desired that the actuator line and the laser drive line overlap, pulse signals of the actuator line often leak to the laser drive line, making it impossible to drive the laser accurately. This is, quite, clearly an undesired problem.

SUMMARY OF THE INVENTION

The present invention is configured such that an actuator line, a laser drive line and a shielding part are laid in the same flexible wiring board, in which the actuator line supplies the actuator with drive signals through a relay circuit board to perform focusing control and tracking control; the laser drive line connects from the laser driving integrated circuit to the laser element to supply the laser element with drive signals to cause it to emit an optical beam; and the shielding part is connected to the ground line, and then, by folding the flexible wiring board, the shielding part is arranged to intervene between overlapping patterns of the actuator line and the laser drive line of the flexible wiring board.

Further, according to the present invention, the pattern of the actuator line, which supplies the actuator with drive signals through a relay circuit board to perform focusing control and tracking control, and the pattern of the laser drive line, which connects from the laser driving integrated circuit to the laser element to supply the laser element with drive signals to cause it to emit an optical beam, the shielding part, which has a wide-region pattern not connected to a contact point of the earth line but has a contact surface electrically conductible to the contact point, are all formed on the same flexible wiring board, and, when the flexible wiring board is folded, the contact point is arranged to come into contact with the contact surface, such that the ground line and the shielding part electrically contact and the shielding part connected to the earth line is sandwiched between the overlapping patterns of the actuator line and the laser drive line of the flexible wiring board.

DESCRIPTION OF THE PREFERRED EMBODIMENTS

Figure 1:
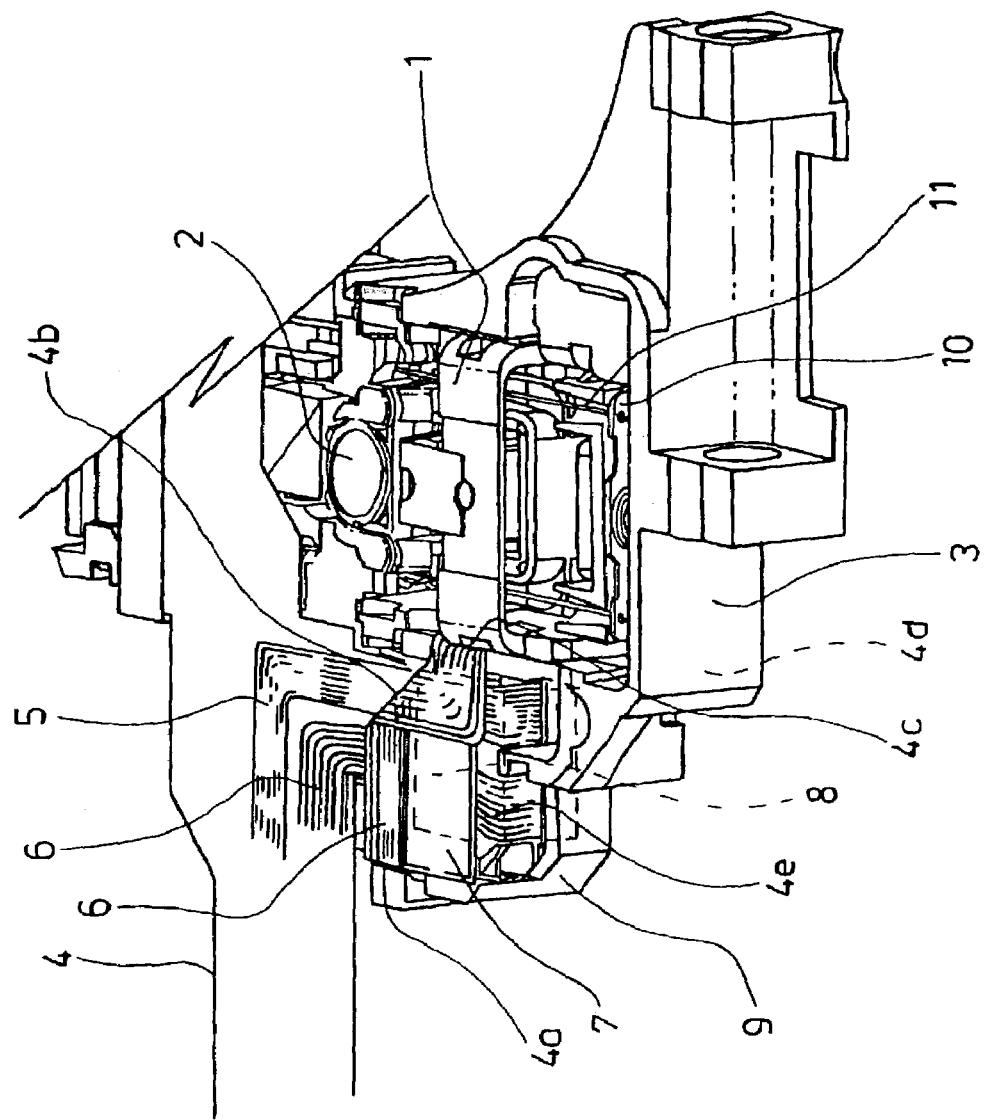
FIG. 1 is a perspective view showing a first embodiment of an optical pickup device according to the present invention.
Figure 2:
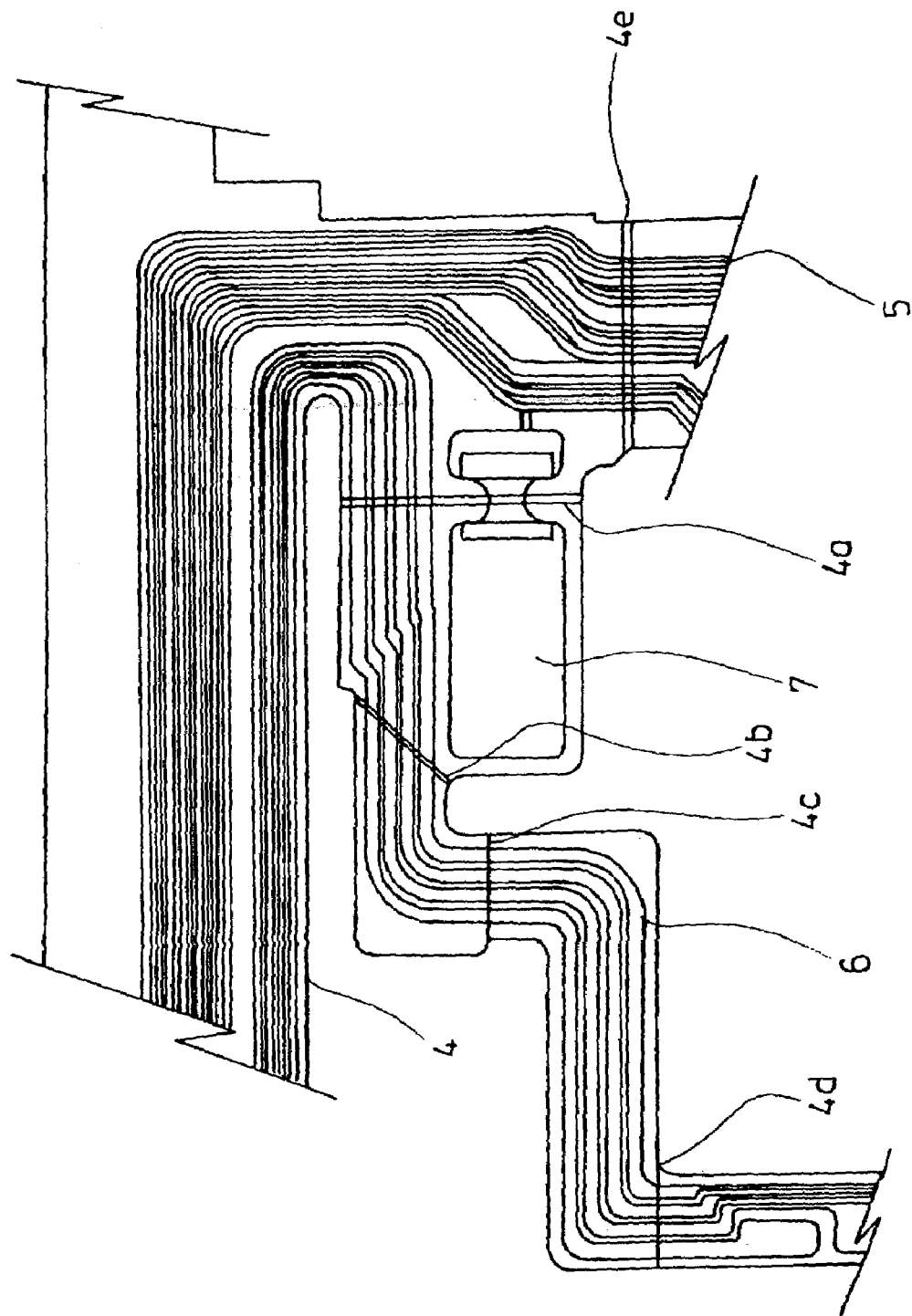
FIG. 2 shows the key portion of the flexible wiring board of the optical pickup device shown in FIG. 1.
Figure 3:
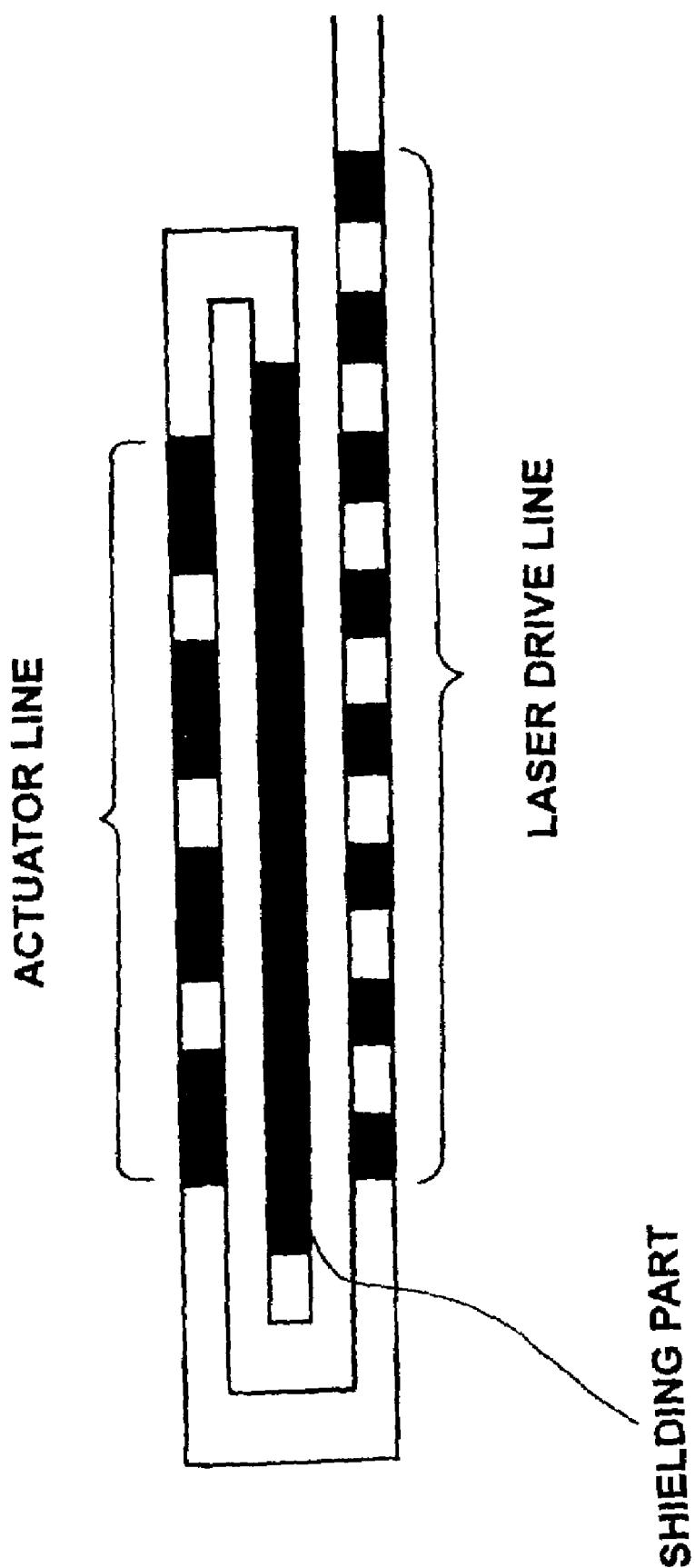
FIG. 3 is a diagram showing a state of a folded portion of the flexible wiring board.

FIG. 1 is a perspective view showing a first embodiment of the optical pickup device according to the present invention. FIG. 2 shows the key portion of the flexible wiring board of the optical pickup device shown in FIG. 1. FIG. 3 is a diagram for explaining the folded state of the flexible wiring board shown in FIG. 2.

An actuator 1 comprises optical and electrical parts, including an objective lens 2, for focusing control and tracking control of a laser beam (a beam of focused laser light) emitted projected on a signal surface of a signal recording medium. This actuator 1 is mounted in a housing 3. A flexible wiring board 4 for supplying control signals to various optical parts is configured with foldable joints so that it may be organized and placed out of sight in a predetermined position.

On the flexible wiring board 4 are provided a laser drive line 5, an actuator line 6 connected to the actuator, and a shielding part 7 having a shielding effect and connected to ground. A laser drive integrated circuit 8 for driving a laser element (not shown) to generate a laser beam is soldered to the laser drive line 5 and is placed inside an enclosure frame 9 of the housing 3.

The flexible wiring board is configured such that the leading end of the actuator line 6 is connected to a relay circuit board 10 which has suspension wires 11 soldered thereto, and the relay circuit board 10 supplies control signals to the actuator 1 for focusing control and tracking control.

The flexible wiring board in FIG. 2, configured as described, is as shown in FIG. 1 when it is folded back at the fold points 4a, 4b, 4c, 4d and 4e. In the folded state of the flexible wiring board 4, as it was folded at the point 4a, the shielding part 7 and the laser drive line 5 intersect at a right angle, and, as it was folded at the point 4b, the actuator line 6 lies over the shielding part 7. This state is shown in the explanatory diagram in FIG. 3. The shielding part 7 is sandwiched between the actuator line 6 and the laser drive line 5.

In the configuration of the present embodiment, as described earlier, the portions of the actuator line 6 and the laser drive line 5 which intersect after folding are shielded from each other, so that leakage of the pulse signals of the actuator line 6 to the laser drive line 5 are prevented.

The optical housing contains a light-detecting element to receive a beam reflected from the signal recording medium. By laying a light-detecting element line, to which the light is connected, and the actuator line 6 in the same flexible wiring board, folding back the flexible wiring board, and providing a shielding part also in some range where the light-detecting element line and the actuator line 6 overlap, it is possible to preclude problems similar to that described above.

Although in this embodiment the shielding part 7 is connected to the ground line, the same effect can be obtained even if the shielding part 7 is not electrically grounded.

As has been described, according to the present invention, the laser driving integrated circuit to drive the laser element is mounted in the optical housing, the pattern of the actuator line for supplying the actuator with drive signals to drive the actuator through a relay circuit board and the pattern of the laser drive line for supplying drive signals from the laser driving integrated circuit to the laser element are formed on the same flexible wiring board, and, when the flexible wiring board is the folded, the shielding part connected to the ground line is arranged comes between the overlapping patterns of the actuator line and the laser driving line of the flexible wiring board. For this arrangement, when the actuator is driven by pulse signals, leakage of the pulse signals to the laser drive line is prevented, which ensures that the laser element will not be effected by pulse signals, and will not be prevented from accurately generating laser beams.

The pattern of the light-detecting element line and the pattern of the actuator line are formed on the same flexible wiring board, and the flexible wiring board is folded, and when the flexible wiring board is folded, the shielding part connected to the ground line enters between the overlapping patterns of the light-detecting element line and the actuator line of the flexible wiring board. With this arrangement, when the actuator is driven by pulse signals, leakage of the pulse signals to the light-detecting element line is prevented, and the actuator can receive a laser beam accurately and free of pulse signal effects.

Figure 4:
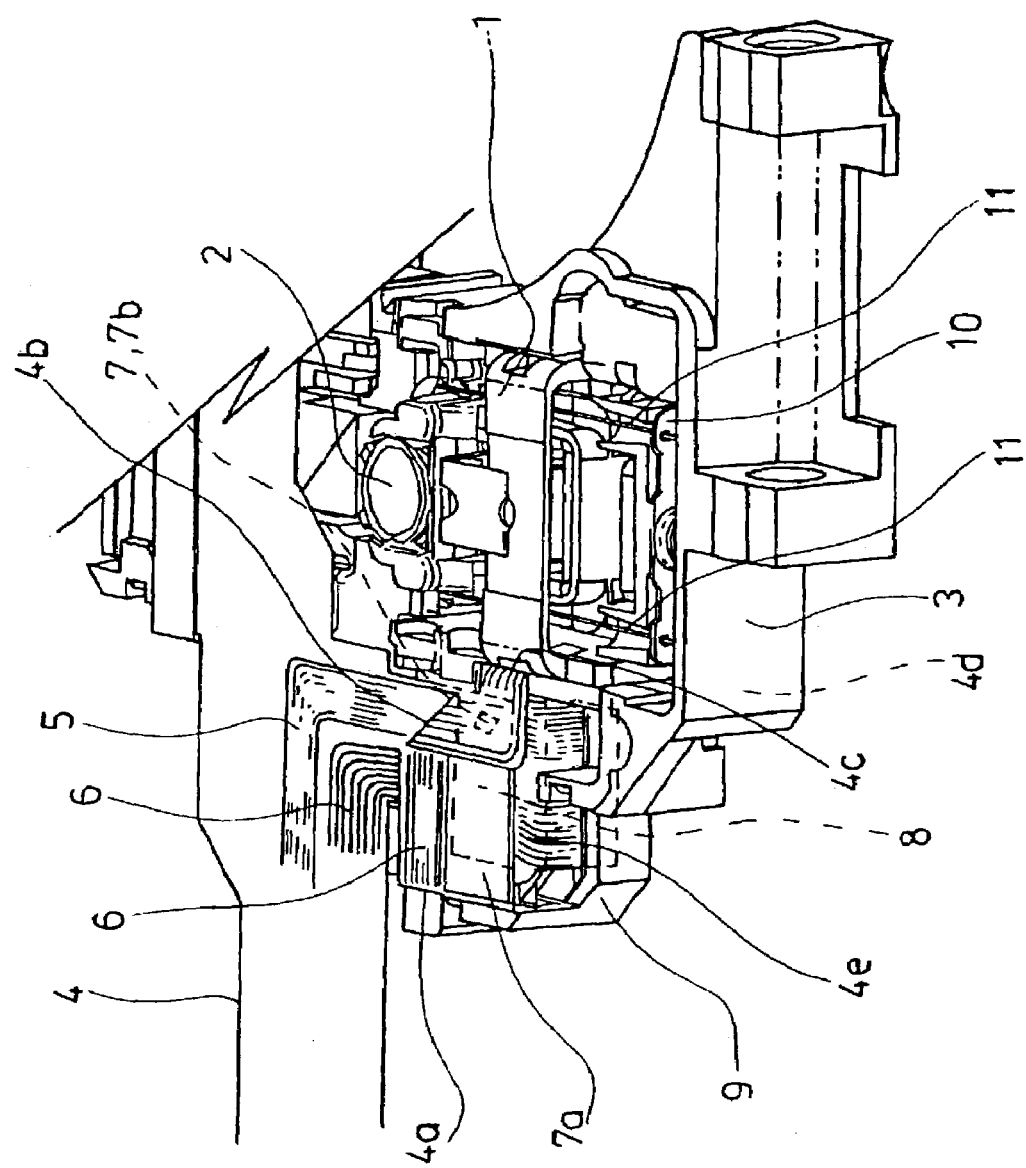
FIG. 4 is a perspective view showing a second embodiment of the optical pickup device according to the present invention.
Figure 5:
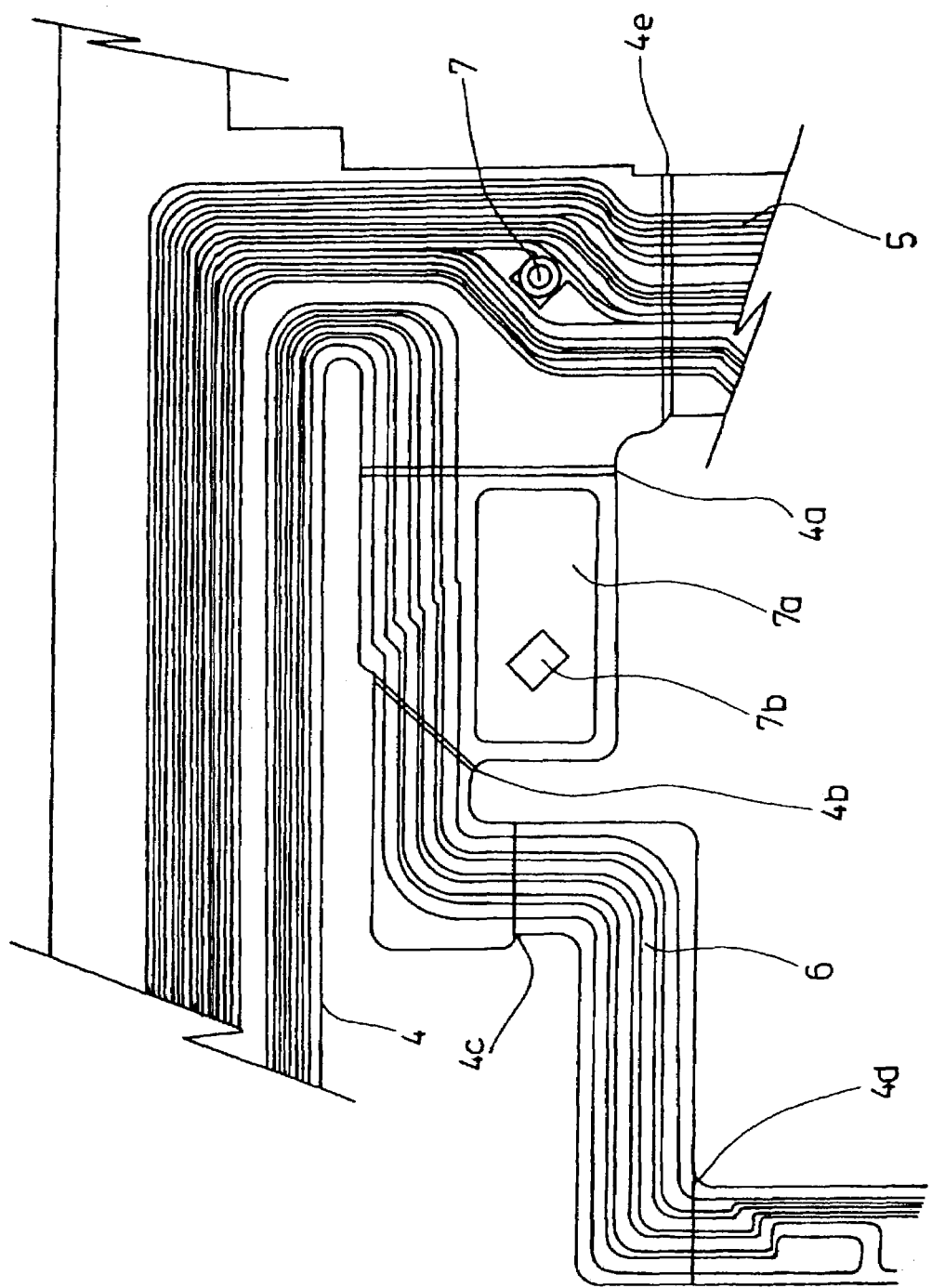
FIG. 5 shows the key portion of the flexible wiring board of the optical pickup device shown in FIG. 4.
Figure 6:
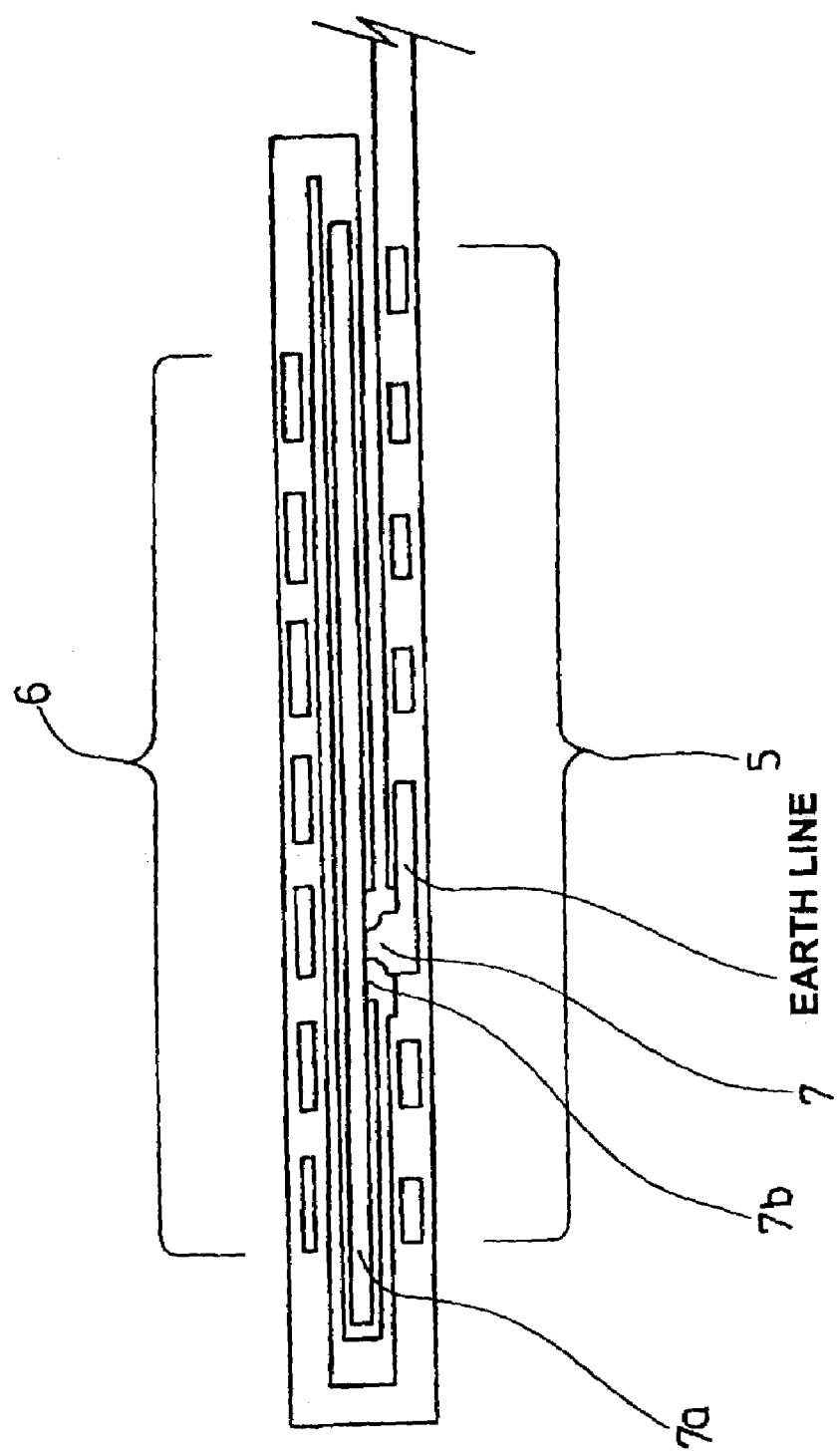
FIG. 6 is a diagram for explaining a state of the folded part of the flexible wiring board shown in FIG. 5.

FIG. 4 is a perspective view showing a second embodiment of the optical pickup device according to the present invention, FIG. 5 shows an essential portion of the flexible wiring board of the embodiment in FIG. 4, and FIG. 6 is a diagram for explaining a folded state of the flexible wiring board in FIG. 5.

The actuator 1 comprises optical and electrical parts, including an objective lens 2 to perform focusing control and tracking control of a laser beam emitted to the signal surface of a signal recording medium, and is mounted in the housing 3. A flexible wiring board is used to supply control signals to various optical parts and has fold points 4a, 4b, 4c, 4d, and 4e at which the flexible wiring board is folded to create an orderly package at a specified location.

On the flexible wiring board 4, there are provided the laser drive line 5, the actuator line 6 connected to the actuator 1, and the shielding part 7a with a wide shielding region while it is electrically connected to the ground line. The shielding part 7a has a contact surface 7b capable of current conduction. A laser driving integrated circuit 8, which drives a laser element (not shown) to generate a laser beam, is soldered to the laser driving line 5. All the noted parts are folded and arranged in the enclosure frame 9 mounted on the housing.

The actuator line 6 is connected at its leading end to the relay circuit board 10 to which the suspension wires 11 are soldered, and supplies control signals to the actuator 1 for focusing control and tracking control.

In the above-noted configuration, the flexible wiring board 4 in FIG. 5 is as shown in the perspective view of FIG. 4 when the flexible wiring board 4 is folded at the fold points 4a, 4b, 4c, 4d and 4e. When the flexible wiring board 4 is folded back at the point 4a, the shielding part 7a lies over the laser drive line 5 at a right angle, while at the same time the contact point 7c comes into contact with the contact surface 7b, and therefore the ground line comes into conductive contact with the shielding part 7a.

When the flexible wiring board 4 is folded at the point 4b, the actuator line 6 comes to lie over the shielding part 7a. This state is shown in the diagram of FIG. 6 illustrating the folded state of the flexible wiring board, in which the shielding part 7a is placed between the actuator line 6 and the laser drive line 5.

Therefore, as described above, the portions of the actuator line 6 and the laser drive line 5, which are caused to intersect by the folding of the flexible wiring board, are shielded from each other by the shielding part 7a, so that leakage of the pulse signals of the actuator line 6 to the laser drive line 5 are prevented.

A light-detecting element that receives a beam reflected from the signal recording medium is mounted in the optical housing. By laying both the light-detecting element line having the light-detecting element connected thereto and the actuator line 6 in the same flexible wiring board, and by also folding back the flexible wiring board to thereby place the shielding part between the light-detecting line and the actuator line 6, the above-mentioned problem can be solved.

As has been described, according to the present invention, the laser driving integrated circuit to drive the laser element is mounted in the optical housing, the actuator line for supplying the actuator with drive signals to drive the actuator through a relay circuit board, the laser drive line for supplying drive signals from the laser driving integrated circuit to the laser element, and the shielding part, which has a wide-region pattern not connected to a contact point of the ground line but has a contact surface electrically conductible to the contact point, are formed on the same flexible wiring board, and when the flexible wiring board is folded back the contact point comes into contact with the contact surface such that the ground line and the shielding part come into electrical contact, the shielding part connected to the ground line is arranged to intervene between the overlapping patterns of the actuator line and the laser driving integrated circuit, with the result that when the actuator is driven by pulse signals, leakage of the pulse signals to the laser drive line is prevented, and the laser element can generate a laser beam accurately, without being affected by stray pulse signals.

The optical housing contains a light-detecting element to receive a beam reflected from a signal recording medium, and the pattern of the light-detecting line connected to the light-detecting element, and of the shielding part, which has a wide-region pattern not connected to a contact point of the ground line but has a contact surface electrically conductible to the contact point, are formed on the same flexible wiring board, in such a manner that, when the flexible wiring board is folded, the contact point comes into contact with the contact surface, the ground line and the shielding part come into electrical contact, and the shielding part connected to the ground line intervenes between the overlapping patterns of the actuator line and the laser driving integrated circuit. As a result, when the actuator is driven by pulse signals, the pulse signals are prevented from leaking to the light-detecting element line, and the light-detecting element line can accurately receive a light beam unaffected by stray pulse signals.

The present invention makes it possible to adopt a less expensive one-sided flexible wiring board, and to avoid a need to provide a shielding part in a double-sided flexible wiring board.

What is claimed is:

1. An optical pickup device comprising an actuator for driving an objective lens to trace a signal track when a light beam is focused on a signal surface of a signal recording medium; an optical housing having mounted therein various optical parts arranged along an optical path to guide a light beam from a laser element to a signal surface of said signal recording medium and along another optical path to guide a reflected light beam from said signal surface to a photodetector, said optical pickup device being assembled by mounting said actuator in said optical housing, wherein a laser driving integrated circuit for driving said laser element is mounted in said housing, wherein a wiring pattern of an actuator line supplying drive signals to drive said actuator through a relay circuit board and a wiring pattern of a laser drive line supplying drive signals from said laser driving integrated circuit to said laser element are formed on the same flexible wiring board, wherein, when said flexible wiring board is folded, a shielding part connected to a ground line is arranged to intervene between overlapping wiring patterns of said actuator line and said laser drive line of the flexible wiring board.

2. An optical pickup device comprising an actuator for driving an objective lens to trace a signal track when a light beam is focused on a signal surface of a signal recording medium; and an optical housing having mounted therein various optical parts arranged along an optical path to guide a light beam from a laser element to a signal surface of said signal recording medium and along another optical path to guide a reflected light beam from said signal surface to a photodetector, said optical pickup device being assembled by mounting said actuator in said optical housing, wherein a light-detecting element for receiving a beam reflected from said signal recording medium is mounted in said optical housing, wherein a wiring pattern of a light-detecting element line having said light-detecting element connected thereto and a wiring pattern of an actuator line are formed on the same flexible wiring board, and wherein, when said flexible wiring board is folded, a shielding part connected to a ground line is arranged to intervene between overlapping wiring patterns of said light-detecting line and said actuator line of said flexible wiring board.

3. An optical pickup device comprising an actuator for driving an objective lens to trace a signal track when a light beam is focused on a signal surface of a signal recording medium; and an optical housing having mounted therein various optical parts arranged along an optical path to guide a light beam from a laser element to a signal surface of said signal recording medium and along another optical path to guide a reflected light beam from said signal surface to a photodetector, said optical pickup device being assembled by mounting said actuator in said optical housing, wherein a laser driving integrated circuit for driving said laser element is mounted in said housing, wherein a wiring pattern of an actuator line for supplying said actuator with drive signals to drive said actuator through a relay circuit board, a pattern of a laser drive line for supplying drive signals from said laser driving integrated circuit to said laser element, and a shielding part, which has a wide-region wiring pattern not connected to a contact point of a ground line but has a contact surface electrically conductible to said contact point are formed on the same flexible wiring board, and wherein, when said flexible wiring board is folded, said contact point comes into contact with said contact surface such that said ground line and said shielding part come into electrical contact and such that said shielding part connected to said ground line comes to intervene between overlapping wiring patterns said actuator line and said laser drive line of said flexible wiring board.

4. An optical pickup device comprising an actuator for driving an objective lens to trace a signal track when a light beam is focused on a signal surface of a signal recording medium; and having mounted therein various optical parts arranged along an optical path to guide a light beam to a signal surface of said signal recording medium and along another optical path to guide a reflected light beam from said signal surface to a photodetector, said optical pickup device being assembled by mounting said actuator in said optical housing, wherein a light-detecting element for receiving a beam reflected from said signal recording medium is mounted in said optical housing, wherein a wiring pattern of a light-detecting element line connected to said light-detecting element, a wiring pattern of an actuator line, and a shielding part, which has a wide-region wiring pattern not connected to a contact point of an ground line but has a contact surface electrically conductible to said contact point, are formed on the same flexible wiring board, and wherein, when said flexible wiring board is folded, said contact point comes into contact with said contact surface, bringing said ground line and said shielding part into electrical contact, and said shielding part is arranged to intervene between overlapping wiring patterns of said light-detecting element line and said actuator line of said flexible wiring board.

* * * * *